(12) United States Patent
Fowers et al.

(10) Patent No.: US 9,509,212 B2
(45) Date of Patent: Nov. 29, 2016

(54) CHARGE PUMP CIRCUIT, INTEGRATED CIRCUIT, ELECTRONIC DEVICE AND METHOD THEREFOR

(71) Applicant: MediaTek Singapore Pte. Ltd., Singapore (SG)

(72) Inventors: Paul Fowers, Kent (GB); Manel Collados Asensio, Aylesford, GA (US)

(73) Assignee: MediaTek Singapore Pte. Ltd., Solaris (SG)

( * ) Notice: Subject to any disclaimer, the term of this patent is extended or adjusted under 35 U.S.C. 154(b) by 0 days.

(21) Appl. No.: 14/872,146

(22) Filed: Oct. 1, 2015

(65) Prior Publication Data

US 2016/0126830 A1 May 5, 2016

Related U.S. Application Data

(60) Provisional application No. 62/072,437, filed on Oct. 30, 2014.

(51) Int. Cl.
| | |
|---|---|
| *H02M 3/07* | (2006.01) |
| *G05F 3/20* | (2006.01) |
| *H03K 19/003* | (2006.01) |
| *H02M 1/36* | (2007.01) |
| *H03K 19/00* | (2006.01) |

(52) U.S. Cl.
CPC .............. *H02M 3/07* (2013.01); *G05F 3/205* (2013.01); *H02M 1/36* (2013.01); *H03K 19/00384* (2013.01); *H02M 2003/071* (2013.01); *H03K 19/0016* (2013.01)

(58) Field of Classification Search
CPC ......... H02M 3/06; H02M 3/073; H03F 3/07; H03K 19/00384; H03K 19/0016; G05F 3/205

USPC ........................................... 327/589, 534–540
See application file for complete search history.

(56) References Cited

U.S. PATENT DOCUMENTS

| | | | |
|---|---|---|---|
| 5,874,850 A | 2/1999 | Pulvirenti | |
| 6,400,211 B1 | 6/2002 | Yokomizo | |
| 8,040,175 B2 | 10/2011 | Raghavan | |
| 8,461,910 B2 * | 6/2013 | Nadimpalli | H02M 3/073 327/536 |
| 8,487,689 B2 * | 7/2013 | Floyd | H03K 17/08122 327/427 |
| 8,830,776 B1 * | 9/2014 | Choy | G05F 1/46 365/218 |
| 2008/0036531 A1 | 2/2008 | Boe | |
| 2008/0122941 A1 * | 5/2008 | Kikuchi | H04N 5/23241 348/222.1 |
| 2008/0218250 A1 | 9/2008 | Kimura et al. | |
| 2013/0106370 A1 | 5/2013 | Lin et al. | |
| 2015/0002195 A1 * | 1/2015 | Englekirk | H03L 7/0891 327/157 |

OTHER PUBLICATIONS

Paul Fowers et al., Title: Charge Pump Circuit, Integrated Circuit, Electronic Device and Method Therefor, pending U.S. Appl. No. 14/872,150, filed Oct. 1, 2015.

(Continued)

*Primary Examiner* — Dinh T Le
(74) *Attorney, Agent, or Firm* — Optimus Patents US, LLC

(57) ABSTRACT

A charge pump circuit for generating a negative voltage has a switched capacitor voltage inverter circuit arranged to receive at least one clock signal and generate a negative voltage therefrom; a regulation control loop providing a feedback path from the output of the switched capacitor voltage inverter circuit to a supply input of the switched capacitor voltage inverter circuit, wherein the regulation control loop has a filter arranged to filter the generated negative voltage; and an output arranged to output the filtered generated negative voltage.

18 Claims, 6 Drawing Sheets

(56) References Cited

OTHER PUBLICATIONS

Pelliconi, Power Efficient Charge Pump in Deep Submicron Standard CMOS Technology, IEEE Journal of Solid-State Circuits, vol. 38, No. 6, pp. 1068-1071, Jun. 2003.

Cho, Negative charge-pump based antenna switch controller using 0.18 um SOI CMOS technology, Electronics Letters, vol. 47, No. 6, Mar. 17, 2011.
Chaudhry, A Linear CMOS SOI SP14T Antenna Switch for Cellular Applications, 2012 IEEE Radio Frequency Integrated Circuits Symposium, pp. 155-158.

* cited by examiner

CHARGE PUMP CIRCUIT, INTEGRATED CIRCUIT, ELECTRONIC DEVICE AND METHOD THEREFOR

CROSS REFERENCE TO RELATED APPLICATIONS

This application claims the benefit of U.S. provisional application No. 62/072,437, filed on Oct. 30, 2014 and incorporated herein by reference.

BACKGROUND

Field of the Invention

The field of this invention relates to a charge pump circuit, an integrated circuit for a charge pump, an electronic device and a method therefor. In particular, the field of the invention may relate to negative voltage generation circuits employing charge pumps to switch off transistor devices.

Background of the Invention

In the field of radio frequency (RF) switches, such as RF silicon-on-insulator (SOI) switches, generally a negative voltage is required in order to disable (turn 'off') the SOI switches under a large RF swing. The generation of a negative voltage allows the RF switch designer to avoid the use of DC blocking capacitors. Such a negative voltage is commonly generated by utilising a charge pump circuit, which requires an oscillator to generate the charge pump clock signals. An oscillator that is coupled to a charge pump circuit that generates a negative voltage would typically exhibit low current consumption, and typically needs to be designed with a minimum possible spur current in order to avoid spurious signals for a wireless application.

The generation of a negative voltage requires a mechanism to translate signals from the normal positive voltage domain to a negative voltage domain, whilst satisfying reliability requirements. Hence, a voltage level shift arrangement is typically provided.

Switched capacitor voltage converter circuits are known that accomplish energy transfer and voltage conversion using capacitors. One known form of switched capacitor voltage converter circuit is the voltage inverter. Here, a first charge pump capacitor is charged to the input voltage during a first half of a switching cycle. During the second half of the switching cycle, its voltage is inverted and applied to a second capacitor and the load. The output voltage is the negative of the input voltage, and the average input current is approximately equal to the output current. The switching frequency impacts the size of the external capacitors required, and higher switching frequencies allow the use of smaller capacitors.

Referring to FIG. 1, a circuit for a low noise, inverting, charge pump circuit 100 is illustrated. This charge pump circuit 100 can provide both a pre-set (−4.1V) output voltage 102 and an adjustable (−0.5V to −4.1V) output voltage 104. An external positive control voltage 106 is utilised to set the negative output voltage. The charge pump circuit 100 is designed for biasing GalliumArsenide (GaAs) Field Effect Transistor (FET) devices, such as power amplifier modules in cellular handsets.

An applied input voltage ($V_{IN}$) is first inverted to a negative voltage at pre-set (−4.1V) negative output voltage 102 by a capacitive charge pump 108. This voltage is then regulated by an internal linear regulator 112, and appears at output voltage 104. The minimum (most negative) output voltage ($V_{OUT}$) achievable is the inverted positive voltage, plus the dropout voltage of the post-regulator.

However, such known negative voltage generation circuits suffer from one or more of the following problems. Known negative voltage generation circuits are arranged to achieve a fixed negative voltage or an adjustable positive voltage. Some known negative voltage generation circuits are arranged to achieve an adjustable negative voltage but the control is performed in the negative supply domain. This has the disadvantage of increasing the current supplied by the negative supply, reducing overall efficiency and increasing the levels of the spurs associated with the negative voltage generation. Furthermore, it is desirable to reduce or minimize the start-up time of the negative voltage generation circuit.

Therefore, there is a need to find a practical solution for generating a negative voltage, say for use with NMOS switching devices, preferably where the technique is programmable and uses the known technique of charge pumps.

SUMMARY

Accordingly, the invention seeks to mitigate, alleviate or eliminate one or more of the above mentioned disadvantages singly or in any combination. Aspects of the invention provide a charge pump circuit, an integrated circuit, an electronic device comprising such a charge pump circuit, and a method therefor as described in the appended claims.

According to a first aspect of the invention, there is provided a charge pump circuit for generating a negative voltage. The charge pump circuit comprises a switched capacitor voltage inverter circuit arranged to receive at least one clock signal and generate a negative voltage therefrom; a regulation control loop providing a feedback path from the output of the switched capacitor voltage inverter circuit to a supply input of the switched capacitor voltage inverter circuit, wherein the regulation control loop comprises a filter arranged to filter the generated negative voltage; and an output arranged to output the filtered generated negative voltage.

Thus, in one embodiment of the invention, the provision of a filter within the negative voltage output regulation loop helps remove high frequency spurious components generated by the clock generator and/or switched capacitor voltage inverter, thereby improving filtering for a regulated negative voltage generator.

Furthermore, in one embodiment of the invention, any noise from the clock generator and/or level shifting on the generated negative voltage may be isolated from the bias voltage output by an integrated filter within the use of a regulation loop.

According to an optional example feature of the invention, the filter may comprise a high order filter, such as a high order filters based on resistor-capacitor (RC) sections arranged to filter a generated negative voltage output from the switched capacitor voltage inverter circuit. In other examples, other frequency-dependent components or circuits may be used, such as inductors, etc. The high order resistor-capacitor (RC)-based filter may comprise resistor-capacitor values arranged to remove clock harmonic content generated by a clock generator providing at least one clock signal.

According to an optional feature of the invention, the filter may be further arranged to separate the generated negative voltage used by the clock generator from a supply at the output of the filter.

According to an optional feature of the invention, the feedback path may comprise an operational amplifier, such that a first input of the operational amplifier represents an output voltage sense of the filtered negative voltage output. In one example, the operational amplifier output may be configured to control a voltage supplied to the switched capacitor voltage inverter circuit.

According to an optional feature of the invention, the operational amplifier is operably coupled to a control circuit that may be arranged to maintain a constant reference voltage applied to a second input of the operational amplifier during a loop start up.

According to an optional feature of the invention, the charge pump circuit may further comprise an additional filter located in the feedback path and configured to sense the negative output voltage. In some examples, the additional filter may be arranged to perform filtering and level shifting for a feedback loop sense of the negative output voltage. In some examples, the additional filter may comprise a resistive divider arranged to perform level shifting coupled to a capacitance to filter spurious energy output from the charge pump circuit.

According to an optional feature of the invention, the regulation control loop may be arranged to function in an open loop mode of operation at start-up of the charge pump circuit to generate the negative voltage and subsequently function in a closed loop mode of operation for regulation once the operational amplifier is active. In some examples, the input voltage of the switched capacitor voltage inverter circuit may be set to a maximum during the start-up open loop mode of operation. In some examples, the switch capacitor voltage inverter comprises a plurality of MOSCAPs and the operational amplifier is configured to generate a maximum charging supply voltage to charge a number of MOSCAPs of the switch capacitor voltage inverter during a loop start up. The maximum charging supply voltage is maintained at this level until the target negative voltage is achieved.

Thus, in some examples, the provision of two-modes of operation of the regulation loop may improve the start-up time, with start-up initially using an open loop mode and regulation being performed closed loop, once the target output is reached. By using the characteristics of the operational amplifier, this transition between control modes can be achieved without the need for an explicit timer circuit.

According to an optional feature of the invention, the charge pump circuit may further comprise a clock generator configured to provide at least one clock signal to the switched capacitor voltage inverter circuit and comprising a level shifting circuit arranged to provide level-shifted charge pump clock signals.

According to an optional feature of the invention, the clock generator may comprise a two-phase clock generator configured to provide two clock signal phases of a generated clock to the switched capacitor voltage inverter circuit such that the charge pump circuit is arranged to provide a charge pump negative voltage output on alternate phases of the generated clock. The two-phase clock generator may be configured to provide a plurality of non-overlapping clock signals having different voltage levels. A use of non-overlapping clocks may prevent low impedance paths that could impact efficiency and operation of the charge pump.

According to an optional feature of the invention, the negative voltage output of the switched capacitor voltage inverter circuit may be input to the two-phase clock generator such that the two-phase clock generator uses the fed back negative voltage in the generation of a number of clock signals that traverse between positive and negative voltage domains.

According to a second aspect of the invention, there is provided an integrated circuit comprising: a charge pump circuit for generating a negative voltage comprising: a switched capacitor voltage inverter circuit arranged to receive at least one clock signal and generate a negative voltage therefrom; a regulation control loop providing a feedback path from the output of the switched capacitor voltage inverter circuit to a supply input of the switched capacitor voltage inverter circuit, wherein the regulation control loop comprises a filter arranged to filter the generated negative voltage; and an output arranged to output the filtered generated negative voltage.

According to a third aspect of the invention, there is provided a method of generating a negative voltage using a charge pump circuit comprising a switched capacitor voltage inverter circuit. The method comprises: receiving at least one clock signal at the switched capacitor voltage inverter circuit; generating a negative voltage by the switched capacitor voltage inverter circuit; filtering the generated negative voltage; outputting the filtered generated negative voltage; and feeding back a value of the filtered negative voltage to set an input supply to the switched capacitor voltage inverter circuit thereby forming a regulation control loop for the charge pump circuit.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention are described with reference to a circuit that includes spurious filtering but where the filter is now included within the regulation control loop. Examples of the invention will be described in terms of a circuit that generates a negative voltage. Examples of the invention will also be described in terms of some auxiliary circuits around it and/or enhanced embodiments, such as level shifting. Examples of the invention will also be described in terms of output voltage that is programmable, whereby the circuit includes filtering to minimise spurious emissions, particularly at RF frequencies, along with measures to improve start-up time.

Figure 1:
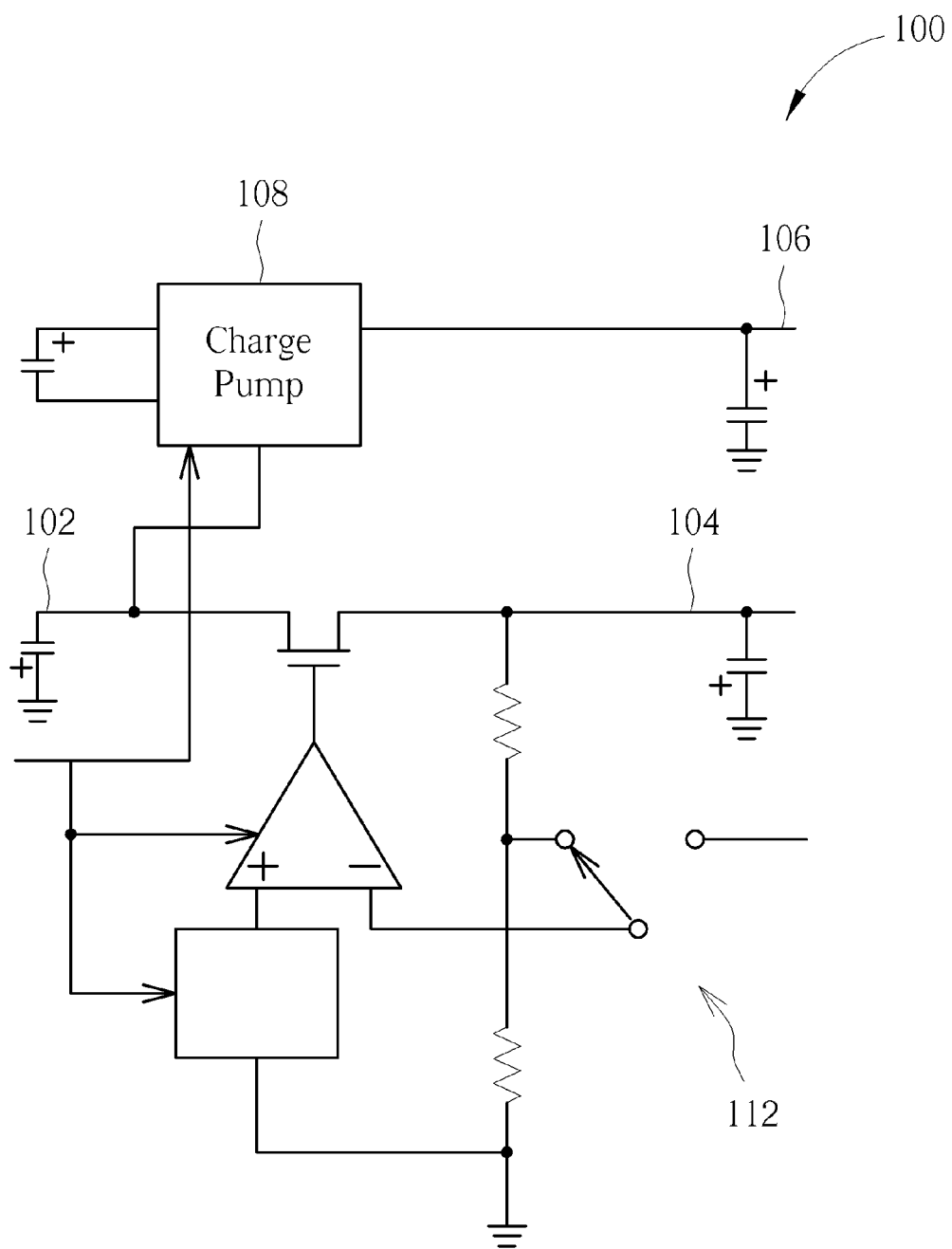
FIG. 1 illustrates a known charge pump circuit.
Figure 2:
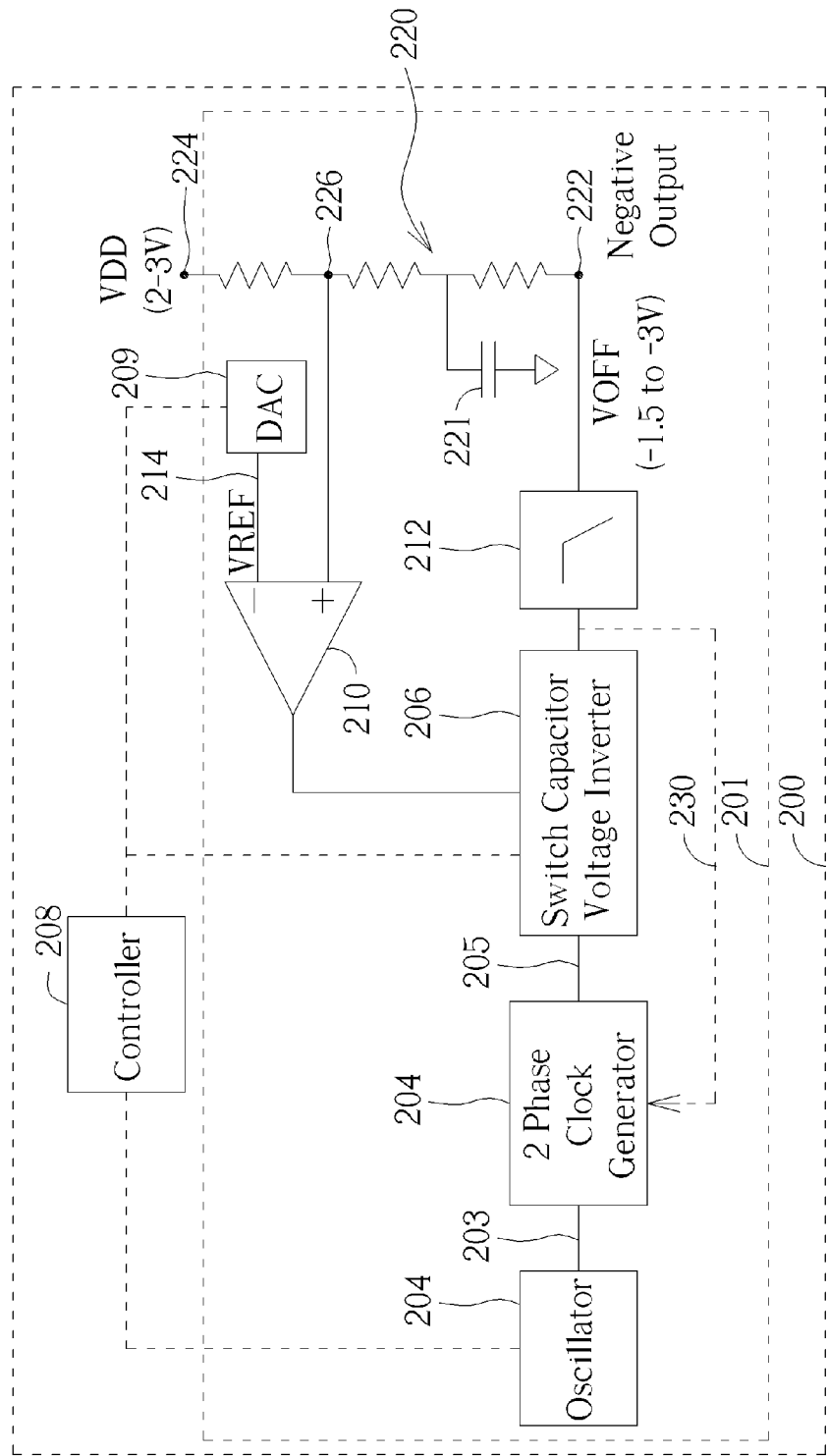
FIG. 2 illustrates a block diagram of an electronic device, such as a wireless communication unit, having an oscillator and a charge pump arranged to generate a regulated negative voltage for a switching application, in accordance with some examples of the invention.

Referring to FIG. 2, a detailed example of an electronic device 200 is illustrated, according to some examples of the invention. In this example, the electronic device 200 may comprise an integrated circuit 201, which may be suitable for a (high-power) RF switching circuit. In this example, the electronic device 200 comprises an oscillator 202. The oscillator 202 is operably coupled to a 2-phase clock generator 204 arranged to generate a 2-phase clock signal 205 (with anti-phases) from an input oscillator signal 203. The 2-phase clock signal 205 output from 2-phase clock generator 204 drives a negative voltage generator circuit, which in this example is a switched capacitor voltage inverter 206. The switched capacitor voltage inverter 206 generates a negative voltage off, $V_{OFF}$, of, say in this example, −1.5V to −3V. In this example, the oscillator 202 and switched capacitor voltage inverter 206 may be further coupled to a controller 208, which may be arranged to control the operations thereof.

In some examples, the negative voltage generator circuit may comprise a level shift circuit. The level shift circuit may be arranged to shift a voltage level supplied to the negative voltage generator circuit (e.g. up to $V_{DD}$ 224, which may be in a range of 2-3 volts) to an output that includes a negative voltage. This negative voltage may be supplied from the switched capacitor voltage inverter 206 to an output node 222 and may comprise a DC voltage in the range of −1.5 to −3 volts. The negative voltage may then be supplied to a number of series-connected high-power RF switches (not shown), which in some examples may be SOI switches. In this manner, the number of series-connected high-power RF switches may be selectively provided with a sufficiently negative voltage to correctly turn off the respective high-power RF switch(es), if needed.

However, in accordance with examples of the invention, a filter 212, for example in a form of an output low-pass filter, is embedded in the output regulation loop. In this example, the filter 212 is arranged to filter the negative voltage signal generated by the switched capacitor voltage inverter 206 (e.g. removing clock harmonics and spurs created by clock signal(s) controlling the switched capacitor voltage inverter 206). In some examples, the filter is a low pass filter and is preferably a multiple-order filter, despite the fact that in known charge pump circuits, filters are generally not included in the output path as filtering adds a phase shift in the regulating feedback loop, which increases the risk of instability. Thus, a compromise exists between an effectiveness of the filtering and maintaining stability of the output voltage regulation. In some practical implementation examples, such a higher order filter 212 may be based on resistive-capacitive (RC) sections. Increasing the order of the filter improves the filtering of the unwanted high frequency components present in the negative output voltage. Also using higher order filters helps with the start-up speed for a given attenuation at high frequencies (RF).

Thus, in this manner, the low-pass filter 212 provides a filtered (clean) negative voltage in the range of −1.5 to −3 volts to output node 222. However, in some examples, there may be a noticeable voltage drop across the resistors of the low-pass filter 212, which may degrade the load regulation of the negative voltage generation. Resistors are included in the filter, together with capacitors, since they provide a mechanism of implementing higher order filters for the reasons previously discussed. Such a voltage drop may be mitigated by using a feedback path to sense the filtered negative voltage at the output of the filter 212. Thus, in some examples, the filtered negative voltage presented at output node 222 is 'sensed' by applying a voltage from a particular point in the resistive network 220. The resistive network 220 is configured such that a positive voltage appears on node 226 and therefore at an input of operational amplifier 210 that forms apart of a regulation control loop providing a feedback path that includes the supply voltage input of the switched capacitor voltage inverter 206.

To ensure stability of the fed back filtered negative voltage, the loop uses the operational amplifier 210 of the regulation to provide any required loop stability compensation. Advantageously, this loop stability compensation may be effected at relatively low frequencies, which is typically much lower than the frequencies of the poles of the filter 212, thereby allowing the use of multiple poles within the filter in order to allow high order filtering of the clock at radio frequencies (RF). Such low frequency stability compensation reduces any transient responses of the output voltage that may have energy well below frequencies where spurious emission may be an issue.

However, using a low frequency feedback path (following a low-frequency filtering operation of the order of less than 1 MHz) may lead to a situation whereby the start-up behaviour may be too slow. In some examples, therefore, and in order to overcome a potential slow start-up, the circuit may initially operate in an open loop mode manner. In this open loop mode example, the regulated input may be initially set to its maximum value during start-up, thereby charging a number of MOSCAPs of the switched capacitor voltage inverter 206.

A first approach to control the feedback control loop is to ensure that the control loop is fast enough to track the changes in an applied (reference) voltage ($V_{ref}$) applied to operational amplifier 210. However, such an approach is complex as it requires a mechanism to implement a changing $V_{ref}$ e.g. controller 208 arranged to use multiple DAC code writes, with associated timing control to provide a programmable output from operational amplifier 210 as the supply voltage input of the switched capacitor voltage inverter 206. In this example, the controller 208 may be operably coupled to a digital-to-analog converter (DAC) 209 to provide a programmable analog input to the operational amplifier 210. Thus, if the control loop is fast enough, it is possible to improve the start-up time by defining a digital ramp going into the DAC 209 that generates $V_{ref}$. This digital ramp has programmable levels and transition times. In some examples, the ramp is programmed to start from a large value to speed-up the negative voltage build-up at the switch capacitor voltage inverter output, and later decrease towards the desired final voltage level. In other examples, the DAC 209 may be replaced by another component or circuit, such as a resistive divider with suitable switches, such that a programmable positive (reference) voltage may be applied to the input of operational amplifier 210. In this manner, the controller 208 is able to control the voltage of the supply to the negative voltage generator circuit 206 of the charge pump and thereby compensate for the voltage drop across the resistors of the low-pass filter 212. Thus, the load regulation may be improved. This approach, although complex, addresses any potential start-up conditions of the feedback control loop.

In an alternative example, $V_{ref}$ may be kept constant during start-up. However, during start-up the operational amplifier 210 could be in an overdriven state, or initially not powered up, in order to reduce standby current. Under these conditions, control of the start-up of the negative voltage generator via $V_{ref}$ is not effective. However, in accordance with examples of the invention, and using this knowledge, the control loop, although configured as open loop, is constructed to charge the output filter 212 at its maximum rate. The output filter 212 is charged at its maximum rate by ensuring that the output of the operational amplifier 210 is configured to generate the maximum charging supply voltage for a number of MOSCAPs of the switch capacitor voltage inverter 206. As the negative output voltage 222 approaches its target voltage, the inputs to the operational amplifier 210 are within the input range and the feedback loop will be active, thereby controlling the settling of the negative output voltage to its final, target value. Advantageously, this mechanism does not require any explicit timing circuit, or control, once the negative voltage generation system 201 is enabled.

In addition to the filter 212 used for the negative output voltage, additional filtering 221 may be placed in the feedback ('sense') path, for example in a form of a resistor-capacitor (R-C) filter. Additional filtering 221 may be included in the feedback path in order to sense the filtered negative voltage from the output filter 212 and further minimise any potential spurious energy from an output sense connection. The additional filtering 221 performs two functions, filtering and level shifting. The output voltage 222 is in the negative voltage domain, but must be translated to a voltage within the input voltage of the operational amplifier 210, typically the positive voltage domain. This is implemented by using a resistive voltage divider 220, which is referenced to a large positive voltage, e.g. VDD 224, to perform the necessary translation. Since the operational amplifier 210 produces the positive supply of the switch capacitor voltage inverter 206, the operational amplifier 210 is a potential source of noise. Since one of the inputs of the operational amplifier 210 is coupled to the negative output via the resistive divider, in order to sense the output voltage, this path can act as a source of unwanted spurious energy. The impact of this path can be advantageously reduced by including capacitance in the resistive divider to filter any unwanted spurious energy through the use of the additional filtering 221. In this manner, a filter 212 is included in a forward path of the loop and an additional filter 221 is included in a feedback sense within the loop.

In some examples, for some clock generators, a feedback path 230 of the output from the switched capacitor voltage inverter circuit 206 may be fed back to the clock generator. In this manner, a non-cleaned version of the output of the switched capacitor voltage inverter circuit 206 is provided to the 2-phase clock generator 204, as any voltage ripple on the negative voltage output is substantially irrelevant to the production of the clock signals within the 2-phase clock generator 204.

In some examples, the 2-phase clock generator 204 of the charge pump circuit may support, for example, two charge pumps in switched capacitor voltage inverter circuit 206 arranged to be controlled alternate phases of a clock frequency, in order to minimise the phase shift associated with the sampling delay of the charge pump. Thus, in this manner, a provision of a 2-phase clock signal 205 output from 2-phase clock generator 204 may facilitate an effective clock rate of twice the clock frequency ($f_{clk}$), which may reduce or minimise any delay through switched capacitor voltage inverter circuit and thereby assist loop stability.

Figure 3:
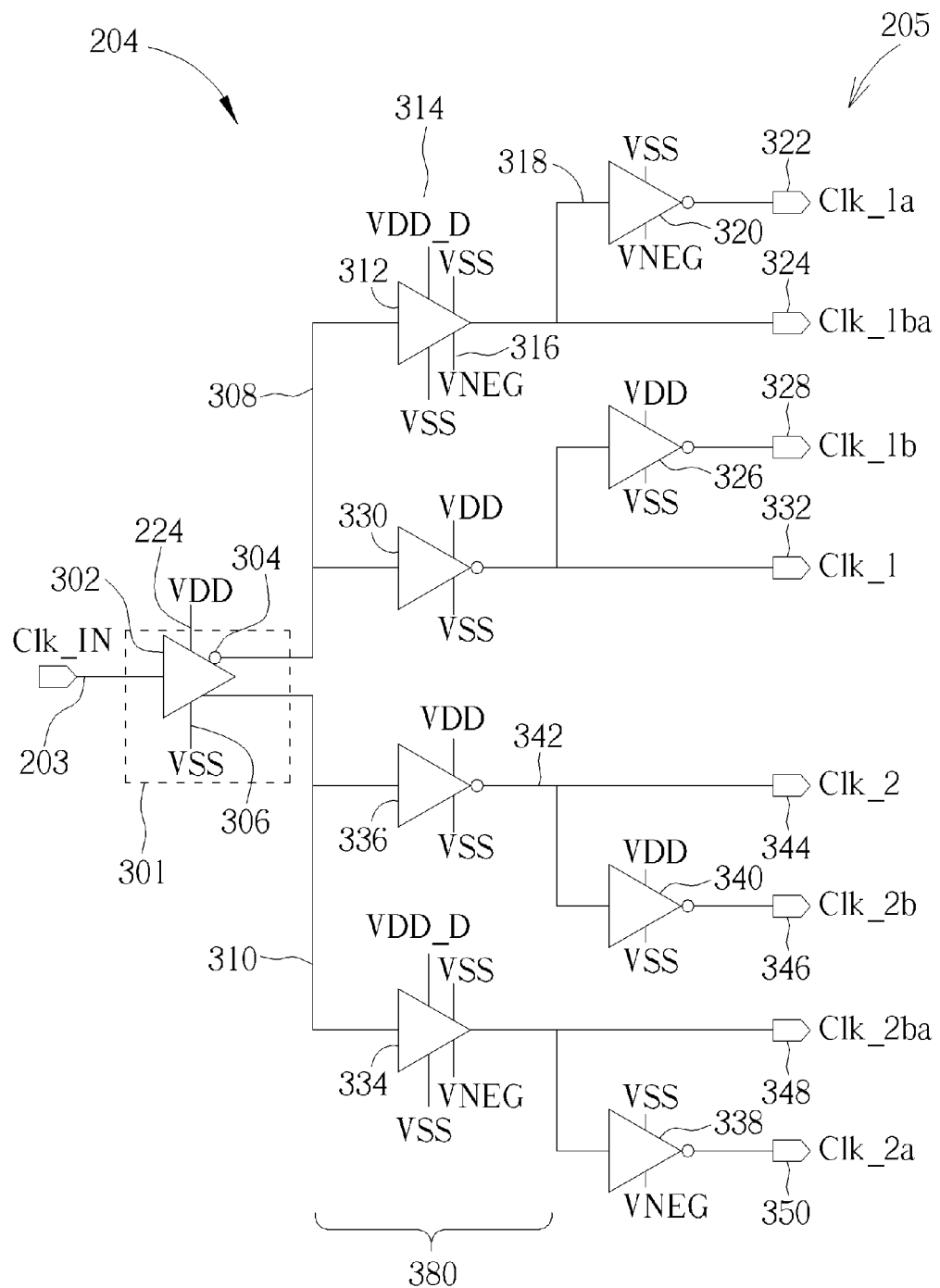
FIG. 3 illustrates an example of a 2-phase clock generation circuit for a charge pump arranged to generate a regulated negative voltage for a switching application, in accordance with some examples of the invention.

Referring to FIG. 3, an example of a 2-phase clock generation circuit for a charge pump is illustrated in accordance with some examples of the invention. The 2-phase clock generation circuit in this example is arranged to generate eight clock signals that are applied to respective switches in the charge pump, i.e. negative voltage generator circuit 206 of FIG. 2, in order to generate a regulated negative voltage for, say, a switching application. In this example, the 2-phase clock generation circuit may be the 2-phase clock generation circuit 204 from FIG. 2, with an input clock signal 203 from an oscillator (not shown) and an output 205 comprising a plurality of different phased clock signals, each related to one of two generated phases and one of two generated voltage levels of the clock signal. In this example, the plurality of different phased clock signals may represent the 2-phase clock signal 205 output from 2-phase clock generator 204 that drives the negative voltage generator circuit of FIG. 2.

In this example, the input clock signal 203 is provided to a non-overlap clock generator 301. The non-overlap clock generator 301 comprises first logic element 302 that is arranged to provide two output clock signals between $V_{DD}$ 224 and $V_{SS}$ 306, the two output clock signals having a different high clock signal pulse period. The first logic element 302 has a positive supply $V_{DD}$, 224 and a second $V_{SS}$, supply 306, such that the output signals traverse between these two levels. The first logic element 302 comprises an inverted output 304 that provides a delayed, inverted representation 308 of the input clock signal 203, as a first phase of the 2-phase clock signal. In this example, the delayed, inverted representation 308 of the input clock signal 203 and a delayed, non-inverted representation 310 are provided to a level shifting circuit 380. The level shifting is performed to achieve control signals of a suitable voltage level and suitable clock edge (e.g. 'trigger' points) to the charge pump. The level shifting circuit 380 creates a clock pulses between $V_{SS}$ 306 and a negative voltage of, say, −1.5V.

Referring back to FIG. 3, the delayed, inverted representation 308 is input to a second further delaying, non-inverting, level shifting logic element 312 that is driven by three supply potentials: a positive supply $V_{DDD\_D}$, 314, second supply $V_{SS}$, 306 and a third supply $V_{NEG}$, 316.

In this example, level shifting is performed to achieve a negative voltage from potentials of $V_{DD}$ 224 and $V_{SS}$ 306 and an intermediate voltage step to positive supply $V_{DD\_D}$, 314 is employed, i.e. an intermediate step prior to providing a negative voltage output, in order to avoid exceeding the selected implementation technology's maximum operating voltage. Such an intermediate voltage step may be achieved for each of the generated 2 (alternate) phases of the clock signal.

In some examples, positive supply $V_{DD\_D}$ 314 can be used as an intermediate voltage level, e.g. ~1V, in a translation from the positive voltage domain to the negative voltage domain. In some examples, it may be additionally or alternatively used to prevent voltage stress in the logic/buffers. The second further delaying, non-inverting, level shifting logic element 312 translates the input clock signal a clock signal between $V_{DD}$ 224 and $V_{SS}$ 306 to a clock signal between $V_{SS}$ 306 and $V_{NEG}$, 316. The output from the second further delaying, non-inverting level shifting logic element 312 is output to a second node 324, identified as providing a Clk_1ba clock signal. The further delayed, inverted representation is also input to a third further delaying, inverting logic element 320 that is driven by second supply $V_{SS}$, 306 and third supply $V_{NEG}$, 316. The output from the third further delaying, inverting logic element 320 is output to a first node 322, identified as providing a Clk_1a clock signal.

The delayed, inverted representation 308 is also input to a fourth further delaying, inverting logic element 330 that is driven by positive supply $V_{DD}$, 224 and second supply $V_{SS}$, 306. The output from the fourth further delaying, inverting logic element 330 is output to a fourth node 332, identified as providing a Clk_1 clock signal. The further delayed, inverted representation is also input to a fifth further delaying, inverting logic element 326 that is also driven by positive supply $V_{DD}$, 224 and second supply $V_{SS}$, 306. The output from the fifth further delaying, inverting logic element 326 is output to a third node 328, identified as providing a Clk_1b clock signal.

The logic element 302 also comprises a non-inverted output that provides a delayed, non-inverted representation 310 of the input clock signal 203, as a second phase of the 2-phase clock signal.

The delayed, non-inverted representation 310 is input to a sixth further delaying, non-inverting level shifting logic element 334 that is driven by the three supply potentials: a positive supply $V_{DD\_P}$, 314, second supply $V_{SS}$, 306 and a third supply $V_{NEG}$, 316. The sixth further delaying, non-inverting, level shifting logic element 334 translates the input clock signal a clock signal between $V_{DD}$ 224 and $V_{SS}$ 306 to a clock signal between $V_{SS}$ 306 and $V_{NEG}$, 316. The output from the sixth further delaying, non-inverting level shifting logic element 334 is output to a seventh node 348, identified as providing a Clk_2ba clock signal. The further delayed, non-inverted representation is also input to a seventh further delaying, inverting logic element 338 that is driven by second supply $V_{SS}$, 306 and a third supply $V_{NEG}$, 316. The output from the seventh further delaying, inverting logic element 338 is output to an eighth node 350, identified as providing a Clk_2a clock signal.

The delayed, non-inverted representation 310 is also input to an eighth further delaying, inverting logic element 336 that is driven by positive supply $V_{DD}$, 224 and second supply $V_{SS}$, 306. The output 342 from the eighth further delaying, inverting logic element 336 is output to a fifth node 344, identified as providing a Clk_2 clock signal. The further delayed, non-inverted representation is also input to a ninth further delaying, inverting logic element 340 that is also driven by positive supply $V_{DD}$, 224 and second supply $V_{SS}$, 306. The output from the ninth further delaying, inverting logic element 340 is output to a sixth node 346, identified as providing a Clk_2b clock signal.

In this manner, the example of a 2-phase clock generation circuit of FIG. 3 provides eight clock outputs, four of which traverse between $V_{DD}$ 224 and $V_{SS}$ 306 and four of which traverse between $V_{SS}$ 306 and $V_{NEG}$, 316. Each of the eight clock output signals is configured to be the inverse phase one of the other clock signals, e.g. with respect to the same voltage level to correctly turn 'on' or turn 'off' MOS switches, as will be explained with respect to FIG. 4.

Figure 4:
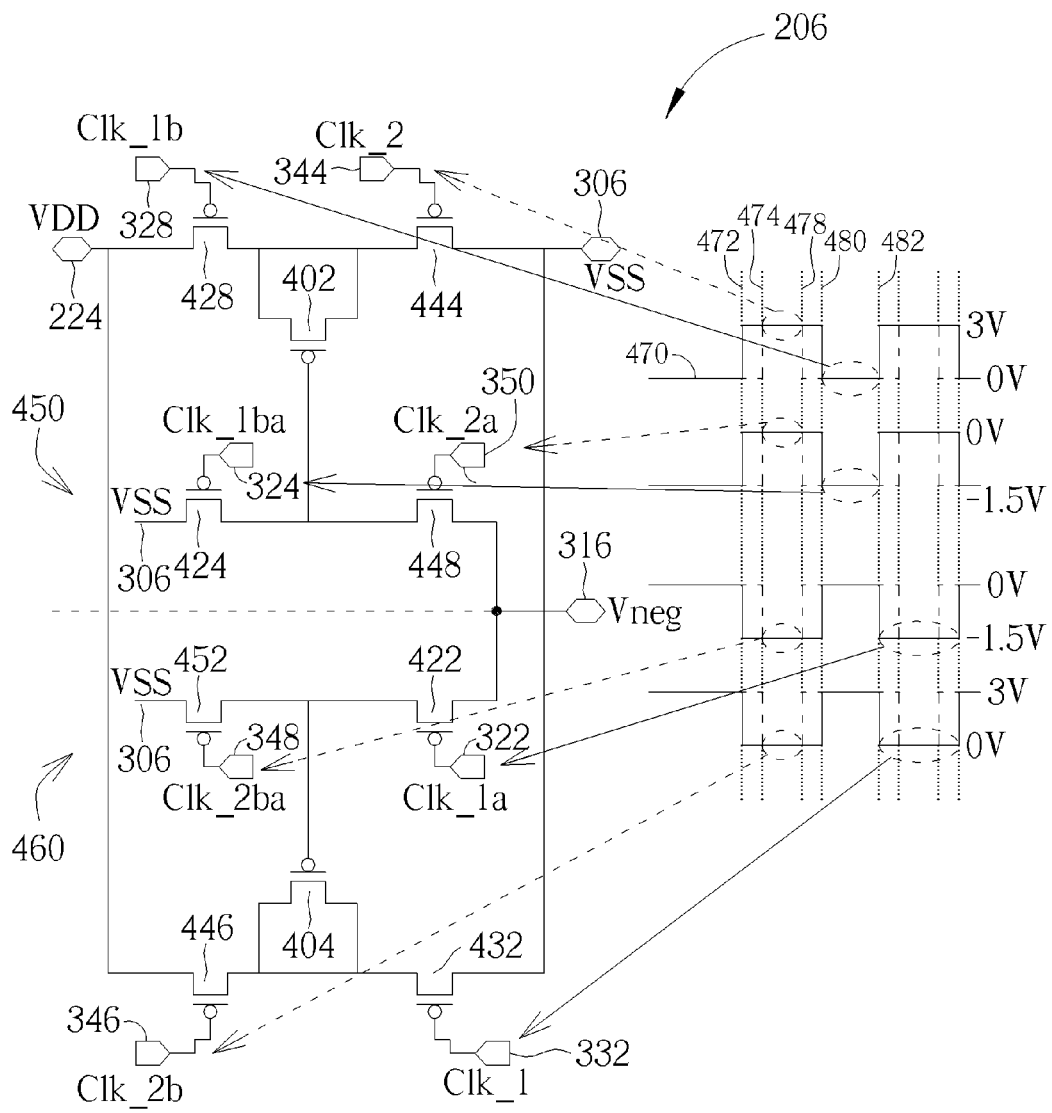
FIG. 4 illustrates an example of an inverter core circuit for a charge pump, in accordance with some examples of the invention.

Referring to FIG. 4, an example of a negative voltage generator circuit is illustrated, for example switched capacitor voltage inverter circuit 206 of FIG. 2. In some examples, the switched capacitor voltage inverter circuit comprises two independent transistor switching arrangements 450, 460 with each driven by a respective set of anti-phase clock signals, for example the clock phases generated in FIG. 3.

In this example, Clk_1b 328 (with clock pulses between $V_{DD}$, 224 and $V_{SS}$, 306) is applied to MOS switch 428 and Clk_1ba 324 (with clock pulses between $V_{SS}$, 306 and $V_{NEG}$, 316) is applied to MOS switch 424. In a first 'LOW' period 470 of Clk_1b 328 and Clk_1ba 324, MOS switch 428 is 'ON' and therefore $V_{DD}$ 224 appears at a first plate of MOSCAP 402. Concurrently, as Clk_1b 328 and Clk_1ba 324 are in-phase, MOS switch 424 is also 'ON' and therefore $V_{SS}$ 306 appears at the opposite plate of MOSCAP 402, thereby resulting in MOSCAP 402 charging to a potential of $V_{DD}$ across its plates.

At clock edge timing 472 where Clk_1b 328 and Clk_1ba 324 go 'HIGH', MOS switch 428 and MOS switch 424 are turned 'OFF', with a potential difference of $V_{DD}$ still being stored or maintained across MOSCAP 402. Prior to clock edge timing 474, Clk_2 344 and Clk_2a 350 are still 'LOW', and therefore MOS switch 444 and MOS switch 448 are both 'OFF'.

At clock edge 474, Clk_2 344 and Clk_2a 350 go 'HIGH', and therefore MOS switch 444 and MOS switch 448 are both turned 'ON'. Hence, the first plate of MOSCAP 402 is now connected to VSS 306 with a potential of VDD remaining across MOSCAP 402. This results in the charge on the second plate of MOSCAP 402 becoming negative at –VDD, thereby providing a $V_{NEG}$ output 316. At timing point 478, Clk_2 344 and Clk_2a 350 go 'LOW', turning 'OFF' MOS switch 444 and MOS switch 448 in preparation for MOS switch 428 and MOS switch 424 being turned 'ON'

At timing point 480 Clk_1b 328 and Clk_1ba 324 go 'LOW', thereby turning 'ON' MOS switch 428 and MOS switch 424. This results in MOSCAP 402 being charged by $V_{DD}$ 224 again. At timing point 482, the charge on MOSCAP 402 is held but isolated from the rest of the circuit. A charge transfer is pushed to the output as $V_{NEG}$ 316 when MOS switches 444 and 448 are turned 'ON', which occurs at timing point 474 in the cycle.

As will be appreciated, the second (e.g. lower in FIG. 4) independent transistor switching arrangement 460 operates in anti-phase to the first (e.g. higher in FIG. 4) independent transistor switching arrangement 450. Thus, during a charging phase of the first independent transistor switching arrangement 450, the second independent transistor switching arrangement 460 provides the negative output $V_{NEG}$ 316, and vice versa.

As illustrated in the example of FIG. 3 and FIG. 4, reliability may be further improved by using a non-overlapping clock generation signal, i.e. one that uses multiple phases of a master clock signal to generate suitable duty cycles, clock inversions and clocks traversing between different voltage levels. In some examples, non-overlapping clocks can be used to ensure that the maximum potential difference appearing across the MOSCAPs 402, 404 is $V_{DD}$ 224 rather than 2*$V_{DD}$ 224, which could occur if switches 428 and 448 were both on simultaneously. Non-overlapping clocks are also used to prevent low impedance paths, e.g. between $V_{NEG}$ 316 and $V_{SS}$ 306, which could impact efficiency and operation of the charge pump.

Figure 5:
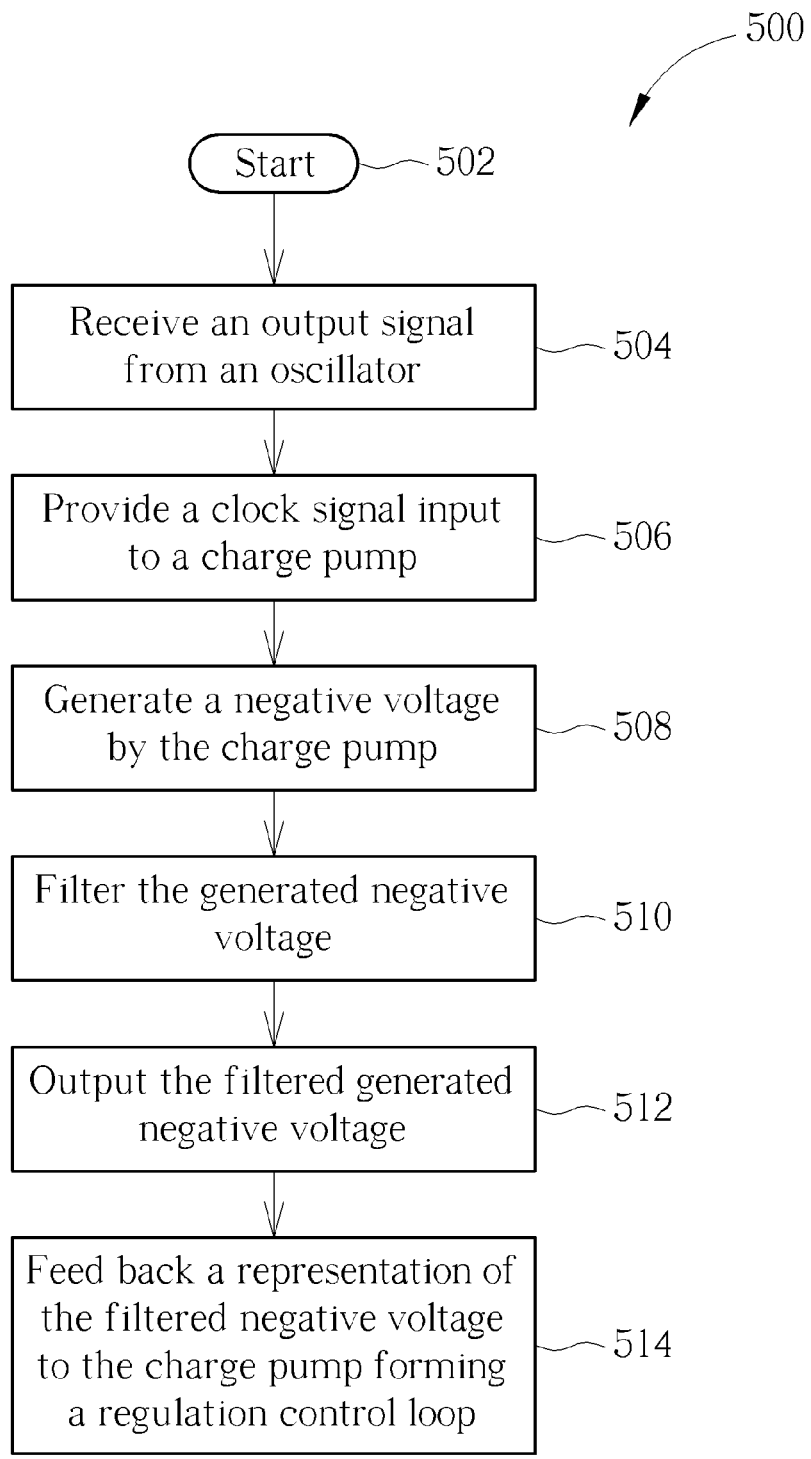
FIG. 5 illustrates an example of a flowchart for a charge pump circuit arranged to generate a regulated negative voltage for a switching application, in accordance with some examples of the invention.

Referring now to FIG. 5, an example of a flowchart 500 for a charge pump circuit arranged to generate a regulated negative voltage for a switching application is illustrated, in accordance with some examples of the invention. The charge pump circuit comprises a charge pump in a form of a switched capacitor voltage inverter circuit, an oscillator; and a clock generator, with the output of the charge pump coupled to at least one filter. The flowchart 500 commences at 502 and an output from the oscillator received at 504. A clock signal is input to the charge pump at 506. At 508, a negative voltage is generated by the charge pump. The generated negative voltage is then filtered at 510, and output at 512. Notably, in this example, filtered negative voltage is also fed back to the charge pump thereby forming a regulation control loop for the charge pump circuit at 514. In this manner, through provision of a filter (and in some examples a higher order filter) within the negative voltage output regulation loop, high frequency spurious components generated by the clock generator and/or switched capacitor voltage inverter may be removed, thereby improving filtering for a regulated negative voltage generator.

Figure 6:
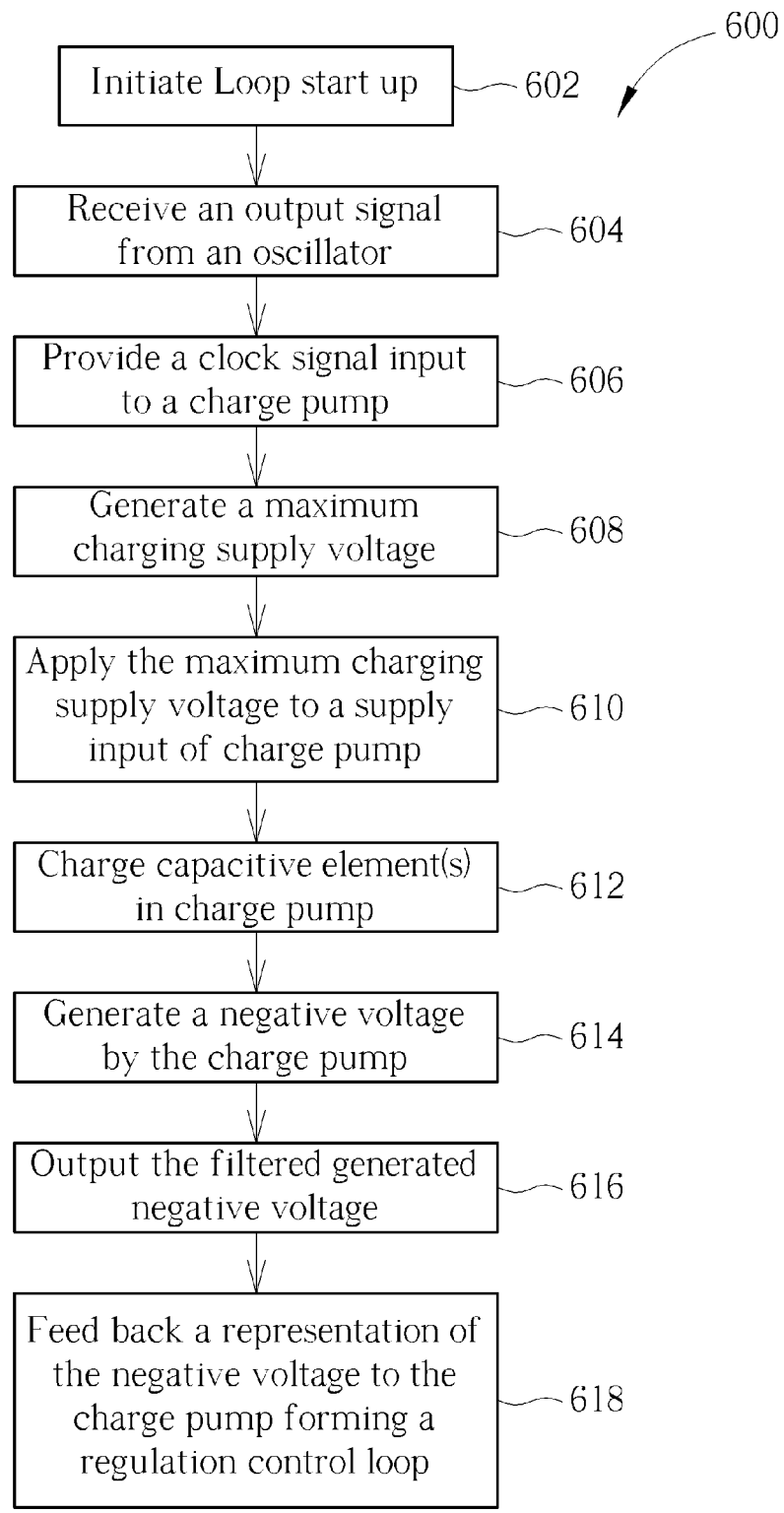
FIG. 6 illustrates a further example of a flowchart for a charge pump circuit arranged to generate a regulated negative voltage for a switching application, in accordance with some examples of the invention.

Referring now to FIG. 6, an alternative example of a flowchart 600 for a charge pump circuit arranged to generate a regulated negative voltage for a switching application is illustrated, in accordance with some examples of the invention. The charge pump circuit comprises a charge pump in a form of a switched capacitor voltage inverter circuit, an oscillator; and a clock generator. The flowchart 600 commences at 602 with a loop start up. An output from the oscillator received at 604. A clock signal is input to the charge pump at 606. At 608, a maximum charging supply voltage is generated and applied at 610 to a supply input of the charge pump (e.g. the switched capacitor voltage inverter circuit during a loop start up). The application of the maximum charging supply voltage to the charge pump charges at least one capacitive element(s) within the charge pump at 612. A negative voltage is generated by the charge pump at 614, and output at 616. Notably, in this example, filtered negative voltage is also fed back to the charge pump thereby forming a regulation control loop for the charge pump circuit at 618. In this manner, through provision of a maximum charging supply voltage to a supply input of the charge pump (e.g. the switched capacitor voltage inverter circuit during a loop start up) it is possible to reduce or minimize the start-up time of the negative voltage generation circuit.

A skilled artisan will appreciate that in other applications, alternative functions/circuits/devices and/or other techniques may be used in the charge pump circuit. For example, in other applications, the output of the charge pump circuit 300 may drive NMOS/PMOS devices with a negative voltage, or indeed different components or devices.

The inventive concept herein described can be applied to any charge pump circuit arranged to generate a negative voltage, particularly one that applies a negative regulated voltage to a high-power switching circuit.

In particular, it is envisaged that the aforementioned inventive concept can be applied by a semiconductor manufacturer to any integrated circuit comprising a charge pump circuit for generating a negative voltage. It is further envisaged that, for example, a manufacturer may employ the inventive concept in a charge pump circuit using discrete components or a semiconductor manufacturer may employ the inventive concept in a design of a stand-alone integrated device, such as an application-specific integrated circuit (ASIC). In one example, an integrated circuit comprises: a charge pump circuit for generating a negative voltage comprising: a switched capacitor voltage inverter circuit arranged to receive at least one clock signal and generate a negative voltage therefrom; a regulation control loop providing a feedback path from the output of the switched capacitor voltage inverter circuit to a supply input of the switched capacitor voltage inverter circuit. The regulation control loop comprises a filter arranged to filter the generated negative voltage. An output is arranged to output the filtered generated negative voltage.

It will be appreciated that, for clarity purposes, the above description has described embodiments of the invention with reference to different functional units and processors. However, it will be apparent that any suitable distribution of functionality between different functional units or circuits, for example with respect to components within the switched capacitor voltage inverter circuit, may be used without detracting from the invention. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed. In addition, singular references do not exclude a plurality. Thus, references to 'a', 'an', 'first', 'second', etc. do not preclude a plurality.

Thus, an improved charge pump circuit having a switched capacitor voltage inverter circuit has been described that is capable of generating a negative voltage and that may support programmability and a reduced start-up time, wherein the aforementioned disadvantages with prior art arrangements have been substantially alleviated.

What is claimed is:

1. A charge pump circuit for generating a negative voltage comprising:
 a switched capacitor voltage inverter circuit having an input arranged to receive at least one clock signal and generate a negative voltage therefrom, a supply input and an output;
 a regulation control loop coupled to the output and providing a feedback path from the output of the switched capacitor voltage inverter circuit to the supply input of the switched capacitor voltage inverter circuit, wherein the feedback path comprises an operational amplifier such that a first input of the operational amplifier represents an output voltage sense of the filtered negative voltage output, wherein the regulation control loop comprises a filter arranged to filter the generated negative voltage; and
 a charge pump circuit output coupled to the output and arranged to output the filtered generated negative voltage,
wherein the regulation control loop is arranged to function in an open loop mode of operation at a start-up of the charge pump circuit to generate the negative voltage and subsequently function in a closed loop mode of operation for regulation once the operational amplifier is active.

2. The charge pump circuit of claim 1, wherein the filter comprises a higher order resistor-capacitor (RC)-based filter configured to remove clock harmonic content of the received at least one clock signal.

3. The charge pump circuit of claim 1, wherein the filter is further arranged to separate the generated negative voltage used by the clock generator from a supply at the output of the filter.

4. The charge pump circuit of claim 1, wherein the operational amplifier output is configured to control a voltage supplied to the switched capacitor voltage inverter circuit.

5. The charge pump circuit of claim 1, wherein an input voltage to the regulation control loop is set to a maximum by the operational amplifier during the start-up open loop mode of operation.

6. The charge pump circuit of claim 1, wherein the operational amplifier within the regulation control loop is configured to provide loop stability compensation at low operational frequencies.

7. The charge pump circuit of claim 1, further comprising a second input of the operational amplifier operably coupled to a control circuit that is arranged to maintain a constant reference voltage applied to the second input constant during a loop start up.

8. The charge pump circuit of claim 1, further comprising an additional filter located in the feedback path and configured to sense the negative output voltage.

9. The charge pump circuit of claim 1, further comprising a clock generator configured to provide at least one clock signal to the switched capacitor voltage inverter circuit and comprising a level shifting circuit arranged to provide level-shifted charge pump clock signals.

10. The charge pump circuit of claim 9, wherein the clock generator comprises a two-phase clock generator configured to provide two clock signal phases of a generated clock to the switched capacitor voltage inverter circuit such that the charge pump circuit is arranged to provide a charge pump negative voltage output on alternate phases of the generated clock.

11. An electronic device comprising the charge pump circuit of claim 1.

12. A charge pump circuit for generating a negative voltage comprising:
a switched capacitor voltage inverter circuit arranged to receive at least one clock signal and generate a negative voltage therefrom and comprising a plurality of MOSCAPs;
a regulation control loop providing a feedback path from the output of the switched capacitor voltage inverter circuit to a supply input of the switched capacitor voltage inverter circuit, wherein the feedback path comprises an operational amplifier configured to generate a maximum charging supply voltage to charge a number of MOSCAPs of the switch capacitor voltage inverter during a loop start up such that a first input of the operational amplifier represents an output voltage sense of the filtered negative voltage output, wherein the regulation control loop comprises a filter arranged to filter the generated negative voltage; and
an output arranged to output the filtered generated negative voltage.

13. A charge pump circuit for generating a negative voltage comprising:
a switched capacitor voltage inverter circuit arranged to receive at least one clock signal and generate a negative voltage therefrom;
a regulation control loop providing a feedback path from the output of the switched capacitor voltage inverter circuit to a supply input of the switched capacitor voltage inverter circuit, wherein the regulation control loop comprises a filter arranged to filter the generated negative voltage;
an output arranged to output the filtered generated negative voltage; and
an additional filter is located in the feedback path and configured to perform both filtering and level shifting for a feedback loop sense of the generated negative output voltage.

14. A charge pump circuit for generating a negative voltage comprising:
a switched capacitor voltage inverter circuit arranged to receive at least one clock signal and generate a negative voltage therefrom;
a regulation control loop providing a feedback path from the output of the switched capacitor voltage inverter circuit to a supply input of the switched capacitor voltage inverter circuit, wherein the regulation control loop comprises a filter arranged to filter the generated negative voltage; and
an output arranged to output the filtered generated negative voltage;
a clock generator configured to provide at least one clock signal to the switched capacitor voltage inverter circuit; and
a level shifting circuit arranged to provide level-shifted charge pump clock signals, wherein the level shifting circuit applies an intermediate step to a regulator output voltage.

15. A charge pump circuit for generating a negative voltage comprising:
a switched capacitor voltage inverter circuit arranged to receive at least one clock signal and generate a negative voltage therefrom;
a regulation control loop providing a feedback path from the output of the switched capacitor voltage inverter circuit to a supply input of the switched capacitor voltage inverter circuit, wherein the regulation control loop comprises a filter arranged to filter the generated negative voltage; and
an output arranged to output the filtered generated negative voltage;
a two-phase clock generator configured to provide two clock signal phases of a generated clock to the switched capacitor voltage inverter circuit such that the charge pump circuit is arranged to provide a charge pump negative voltage output on alternate phases of the generated clock; and
a level shifting circuit arranged to provide level-shifted charge pump clock signals, wherein the two-phase clock generator is configured to provide a plurality of non-overlapping clock signals having different voltage levels.

16. The charge pump circuit of claim 15, wherein the negative voltage output of the switched capacitor voltage inverter circuit is input to the two-phase clock generator and the two-phase clock generator uses the fed back negative voltage in a generation of a number of clock signals that traverse between the negative voltage and a voltage potential.

17. An integrated circuit comprising:
a charge pump circuit for generating a negative voltage comprising:
a switched capacitor voltage inverter circuit having an input arranged to receive at least one clock signal and generate a negative voltage therefrom, a supply input and an output;
a regulation control loop coupled to the output and providing a feedback path from the output of the switched capacitor voltage inverter circuit to the supply input of the switched capacitor voltage inverter circuit, wherein the feedback path comprises an operational amplifier such that a first input of the operational amplifier represents an output voltage sense of the filtered negative voltage output, wherein the regulation control loop comprises a filter arranged to filter the generated negative voltage; and
a charge pump circuit output coupled to the output and arranged to output the filtered generated negative voltage,
wherein the regulation control loop is arranged to function in an open loop mode of operation at a start-up of the charge pump circuit to generate the negative voltage and subsequently function in a closed loop mode of operation for regulation once the operational amplifier is active.

18. A method of generating a negative voltage using a charge pump circuit comprising a switched capacitor voltage inverter circuit, the method comprising:
providing at least one clock signal input to the switched capacitor voltage inverter circuit;
generating a negative voltage by the switched capacitor voltage inverter circuit;
filtering the generated negative voltage;
outputting the filtered generated negative voltage; and
feeding back the filtered negative voltage to set an input supply to the switched capacitor voltage inverter circuit thereby forming a regulation control loop for the charge pump circuit, wherein the regulation control loop is arranged to function in an open loop mode of operation at a start-up of the charge pump circuit to generate the negative voltage and subsequently function in a closed loop mode of operation for regulation once the operational amplifier is active.

* * * * *